(12) United States Patent
Steiger et al.

(10) Patent No.: US 9,966,869 B2
(45) Date of Patent: May 8, 2018

(54) MODULAR HIGH VOLTAGE SUPPLY SYSTEM

(71) Applicant: ABB Schweiz AG, Baden (CH)

(72) Inventors: Matthias Steiger, Bitterfield-Wolfen (DE); Janusz Szczechowski, Leipzig (DE); Bernhard Wanzek, Schkopau (DE)

(73) Assignee: ABB Schweiz AG, Baden (CH)

( * ) Notice: Subject to any disclaimer, the term of this patent is extended or adjusted under 35 U.S.C. 154(b) by 0 days. days.

(21) Appl. No.: 15/603,486

(22) Filed: May 24, 2017

(65) Prior Publication Data

US 2017/0264207 A1   Sep. 14, 2017

Related U.S. Application Data

(63) Continuation of application No. PCT/EP2015/077135, filed on Nov. 19, 2015.

(30) Foreign Application Priority Data

Nov. 25, 2014   (EP) .................................... 14003965

(51) Int. Cl.
*H02B 1/26* (2006.01)
*H02M 5/16* (2006.01)
(Continued)

(52) U.S. Cl.
CPC ................ *H02M 5/16* (2013.01); *H02B 1/26* (2013.01); *H02G 5/06* (2013.01); *H05K 5/0008* (2013.01);
(Continued)

(58) Field of Classification Search
None
See application file for complete search history.

(56) References Cited

U.S. PATENT DOCUMENTS 7,837,496 B1 * 11/2010 Pal ....................... H01R 9/2466
361/712
7,973,632 B2 * 7/2011 MacLennan ............ H01F 27/06
336/200
(Continued)

FOREIGN PATENT DOCUMENTS

CN        203013993 U      6/2013
CN        103661003 A      3/2014
(Continued)

*Primary Examiner* — Courtney Smith
(74) *Attorney, Agent, or Firm* — Leydig, Voit & Mayer, Ltd.

(57) ABSTRACT

A modular high voltage supply system has a mobile adapter transformer with a high-voltage output side and a low-voltage input side, electrical connecting input-terminals being foreseen at the mobile adapter transformer outer surface, a mobile container with a low voltage supply system, mounted stationarily therein, having a high current busbar and at least one electrical frequency converter connected thereto, electrical connecting output-terminals for the high current busbar being foreseen at an accessible the mobile container edge; and a modular interim busbar system, for temporary electrical connection of input- and output-terminals, having at least one interim busbar with at least one elongated busbar basic module mounted on a frame structure and respective resilient electrical connections on both busbar basic module ends forming an electrical connection to the input- and/or output-terminals and arranged such that a transmission of vibrations from the mobile adapter transformer to the mobile container is suppressed.

12 Claims, 4 Drawing Sheets

Fig. 1

(51) Int. Cl.
*H02G 5/06* (2006.01)
*H05K 5/02* (2006.01)
*H05K 5/00* (2006.01)
*H05K 7/20* (2006.01)

(52) U.S. Cl.
CPC ....... *H05K 5/0247* (2013.01); *H05K 7/20936* (2013.01); *H05K 7/20309* (2013.01); *H05K 7/20318* (2013.01)

(56) References Cited

U.S. PATENT DOCUMENTS

| | | | | |
|---|---|---|---|---|
| 2009/0085702 | A1* | 4/2009 | Zeng | H01F 27/292 336/107 |
| 2014/0334118 | A1* | 11/2014 | Neumann | H05K 7/1432 361/752 |
| 2015/0357923 | A1* | 12/2015 | Nakazawa | H02M 3/33576 363/17 |
| 2016/0242308 | A1* | 8/2016 | Nakazawa | H02M 3/33576 |

FOREIGN PATENT DOCUMENTS

| | | | |
|---|---|---|---|
| DE | 19735835 | A1 | 2/1999 |
| JP | 2001351438 | A | 12/2001 |
| JP | 2002142317 | A | 5/2002 |
| JP | 2005347540 | A | 12/2005 |
| JP | 2007014099 | A | 1/2007 |

* cited by examiner

MODULAR HIGH VOLTAGE SUPPLY SYSTEM

CROSS-REFERENCE TO RELATED APPLICATIONS

This application is a bypass continuation of International Application PCT/EP2015/077135, filed on Nov. 19, 2015, and claims benefit to European Patent Application No. 14003965.2 filed on Nov. 25, 2014, the entire disclosure of each of which is hereby incorporated by reference herein. The International Application was published in English on Jun. 2, 2016, as WO 2016/083243 A1 under PCT Article 21(2).

FIELD

The invention is related to a modular high voltage supply system.

BACKGROUND

It is known that synchronous generators are used for the conversion of mechanical into electrical energy. Dependent on the frequency of rotation and the excitation of the rotor winding of the synchronous generator a voltage with a corresponding height and frequency will be generated. Such a variable power source might be required as auxiliary power supply in a power plant for example.

The rated power of such variable auxiliary power supplies with rotating generators might be around 12 MVA/4 MW for example wherein the rated output voltage might amount 10 kV. In the case that such a generator is not ready for operation during a certain time, for example due to scheduled maintenance or a breakdown, a prompt replacement is required in order to supply the respective loads with electric energy of the desired voltage and frequency anyhow.

But also for purposes of testing of electrical equipment such as high power transformers, for example with a rated power of 100 MW and above, a variable power source might be required. For the test of such large components it is more common to transport the test equipment to the component to be tested instead of transporting the component to the test equipment.

Disadvantageously within the state of the art is that the transport of a variable power source with rotating generator is rather difficult and time consuming due to its high weight and size. In case of a temporary installation for test purposes it has also to be ensured, that a suitable groundwork is available at the installation site of the generator.

SUMMARY

An aspect of the invention provides a modular high voltage supply system, comprising: a mobile adapter transformer including a high-voltage output side, a low-voltage input side, and electrical connecting input-terminals, configured for the low-voltage input-side, provided at an outer surface of the mobile adapter transformer; a mobile container including a low voltage supply system mounted stationary therein, the low voltage supply system including a high current busbar and an electrical frequency converter connected thereto, electrical connecting output-terminals for the high current busbar being provided at an accessible edge of the mobile container; a modular interim busbar system configured for temporary electrical connection of the input- and output-terminals, wherein the modular interim busbar system includes an interim busbar including an elongated busbar basic module, mounted on a frame structure, and a respective resilient electrical connection on both ends of the busbar basic module which form an electrical connection to the input- and/or output-terminals and which are arranged such that a transmission of vibrations from the mobile adapter transformer to the mobile container is suppressed, wherein the resilient electrical connection includes a first and a second resilient elongated plate-like clamping element, wherein the first and second resilient elongated plate-like clamping elements are arranged opposed to each other in a clamping distance, wherein the first and second resilient elongated plate-like clamping elements are an electrical active part of an interim busbar, and wherein both ends of the opposed clamping elements include a respective electrical contact section, between which a respective further electrical active section of the interim busbar is clamped.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
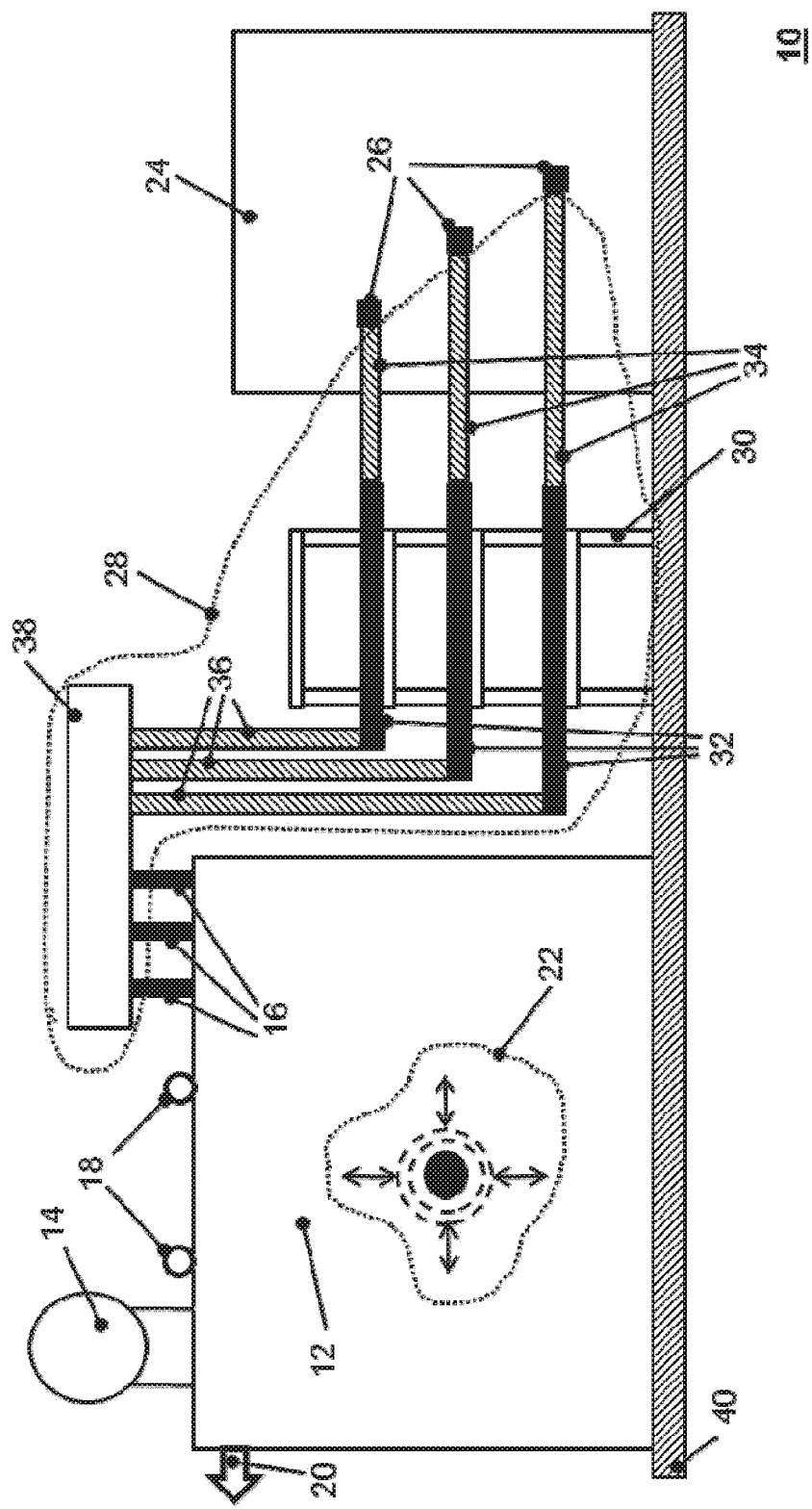
FIG. 1 an exemplary modular high voltage supply system.

An aspect of the invention is related to a modular high voltage supply system, comprising a mobile adapter transformer with a high-voltage output side and a low-voltage input side, wherein electrical connecting input-terminals for the input-side are foreseen at the outer surface of the mobile adapter transformer, further comprising a mobile container with a low voltage supply system mounted stationary therein which comprises a high current busbar and at least one electrical frequency converter connected thereto, wherein electrical connecting output-terminals for the high current busbar are foreseen at an accessible edge of the mobile container and further comprising a modular interim busbar system for the temporary electrical connection of input- and output-terminals Based on this background it an aspect of the invention to provide a mobile variable power supply within the power range of a few MVA and above which is easy to transport and to mount on site.

An aspect of the invention provides a modular high voltage supply system of the aforementioned kind. This is characterized in that the modular interim busbar system comprises at least one interim busbar with at least one elongated busbar basic module mounted on a frame structure and respective resilient electrical connection means on both ends of the busbar basic module which form an electrical connection to the input- respectively output-terminals and which are arranged in a way, that a transmission of vibrations from the mobile adapter transformer to the mobile container is suppressed.

Basic idea of an aspect of the invention is to replace a rotating generator by a variable power electronic based electrical frequency converter which is arranged with further components such as VAR compensators or the like in a container and which is easy to transport therewith. Since the output voltage of typical frequency converters is in the range of 400V—whereas the required output voltage might amount 10 kV—a mobile adapter transformer is foreseen for adapting the voltage level accordingly. In some cases such adapter transformer might already be available on site without the need for transportation. Dependent on the needs on site it is also possible to provide a mobile adapter transformer with an output voltage of for example 6 kV instead of 10 kV. So the whole modular high voltage supply system comprises two main components which preferably are both mounted in a respective container, for example a standard 6 m or 12 m container, and which are easily to transport on site therewith.

After placing those components on site—preferably close together in a neighboring position—the container with the low voltage supply system and the adapter transformer have to become electrically connected. The low voltage supply system itself is foreseen to be supplied by an electrical supply on site which can be assumed to be available in a power plant or on a test site. Due to the low output voltage of approximately 400V of the low voltage supply system and due to the high rated power of for example 12 MVA the electrical connection to the adapter transformer has to be foreseen for current levels in the range of 1000 A and above. Furthermore the electrical connection has to be as flexible as possible in order to enable a variable positioning of the container with the LV supply system and the adapter transformer.

According to an aspect of the invention a modular interim busbar system is foreseen for this connection. A busbar can easily be designed for sufficient high currents by increasing its cross section respectively. The base module of the interim busbar is a preferably electric insulating frame structure with an elongated busbar basic module mounted thereon. This might be designed as a massive bar from an electric conducting material. Since the power supply is typically three phased also the modular interim busbar system is preferably three phased and comprises three interim busbars.

A busbar or a busbar module is made for example from copper or aluminum. This are rather stiff materials, so a transmission of vibrations—for example 50/60 Hz respectively 60/120 Hz generated by the adapter transformer—to the container with the LV power supply is afforded therewith in a disadvantageously way. In order to suppress the transmission of vibrations inbetween adapter transformer and container of LV supply system resilient electrical connection means are foreseen on both ends of the busbar basic module. Such resilient electrical connection means have a spring characteristic at least in the direction of one degree of freedom in movement. So, in case that the two resilient electrical connection means on both ends of the busbar basic module are arranged with different orientations respectively perpendicular each to each other, a transmission of vibrations is suppressed in an advantageous way. Dependent on the concrete geometrical arrangement also one single resilient electrical connection means might be sufficient.

The resilient electrical connection means may be connected electrically in series with the base module and further modules of the busbar, so that an electrical connection inbetween the input- and the output-terminals is gained therewith. Preferably a set of modules with different selectable sizes is provided so that variable distances can be bridged therewith by mounting the modules individual according to the requirements on site. The electrical connecting output-terminals for the high current busbar of the container are for example accessible over a closeable opening at the side wall of the container, so that it can be closed during transportation.

According to a further embodiment of the invention a resilient electrical connection means comprises a first and second resilient elongated plate-like clamping element which are arranged opposed each to each other in a clamping distance and which both are electrical active part of an interim busbar. Such an embodiment provides on one side a sufficient high spring characteristic and is on the other side rather easy to mount.

According to a further embodiment of the invention both ends of the opposed clamping elements comprise a respective electrical contact section wherein a respective further electrical active section of the interim busbar is clamped between. Preferably the further electric active section of the busbar has a comparable thickness like the busbar base module, so the clamping is simplified therewith.

According to a preferred embodiment of the invention opposed elongated clamping elements are connected together by means of screws or bolts extending through the respective contact sections and through the respective electrical active section of the interim busbar clamped inbetween, which are provided with respective boreholes accordingly. By screws or bolts a sufficient high pressure can be applied on the components to be connected so that the connection complies with required electrical characteristics. Furthermore such a kind of connection is easily solvable so that a temporary installation of a modular high voltage system can easily dismounted.

According to another variant of the invention elongated clamping elements are made at least predominantly from copper or aluminum. This is suitable conductor material for conducting a high electrical current.

According to a further embodiment of the invention two or more neighbored clamping elements are arranged in parallel in the same plane instead of a single clamping element. This facilitates mounting the resilient electrical connection means in an advantageous way.

According to a further embodiment of the invention the modular interim busbar comprises an electrical active elongated square-shaped hollow busbar section. A weight reduction of the interim busbar is gained therewith in an advantageous way.

According to another variant of the invention the input terminals of the mobile adapter transformer are extending into the elongated square-shaped hollow busbar section in a form-locking manner. By adapting the inner square shape of the hollow busbar to the preferably square shaped outer diameter of the input terminals the electrical connection is facilitated therewith.

According to a further embodiment of the invention resilient electrical connection means are extending into the elongated square-shaped hollow busbar section in a form-locking manner. By adapting the inner square shape of the hollow busbar to the preferably square shaped outer diameter of resilient electrical connection means the electrical connection is facilitated therewith.

According to another embodiment of the invention the input terminals or the resilient electrical connection means extending into the elongated square-shaped hollow busbar section are connected thereto by means of screws or bolts. By screws or bolts a sufficient high pressure can be applied on the components to be connected so that the connection complies with required electrical characteristics. Furthermore such a kind of connection is easily solvable so that a temporary installation of a modular high voltage system can easily dismounted.

According to a further embodiment of the invention the elongated square-shaped hollow busbar section is made at least predominantly from aluminum. A further weight reduction is gained therewith in an advantageous way.

According to a further embodiment of the invention the modular interim busbar system comprises three interim busbars wherein the respective busbar basic modules are arranged within the frame structure in a horizontal and vertical distance each to each other. By arranging the basic modules diagonally the interim busbars can be mounted in an easier way since they are better accessible.

According to a further embodiment of the invention the mobile container with the low voltage supply system comprises a cooling system. For a rated power of for example 10 MVar installed several frequency converters of a lower rated power are required which are arranged phase wise and also in parallel. To ensure that the heat losses are dissipated from the inner of the container a cooling system, for example with condenser and evaporator, is foreseen.

According to a preferred embodiment of the invention the mobile container is a standard container according to CSC (Container Safety Convention) standard. Several transport systems exist for those kinds of containers, such as trucks, trains and ships so that a transportation of the low voltage supply system in such a container is facilitated therewith.

Further advantageous embodiments of the invention are mentioned in the dependent claims.

FIG. 1 shows an exemplary modular high voltage supply system 10 from a side view. A mobile adapter transformer 12 with a rated voltage of 400V on its input side and 10 kV on its output side is temporarily arranged on a ground floor 40. On the top of the adapter transformer 12 an oil expansion vessel 14, lifting lugs 18 and three input terminals 16 for the electrical connection of the input side are foreseen. Respective output terminals 22 for the 10 kV output side for the supply of electrical loads are indicated with an arrow.

An exemplary vibration source 22 in the center of the adapter transformer indicates operational vibrations of 50 Hz and an integer multiple therefrom, which are rising during the operation of the adapter transformer.

Neighbored and in parallel to the adapter transformer 12 a mobile container 24 with a low voltage supply system is temporarily placed on the ground floor 40. The container 24 comprises three output terminals 26 for its inner high-current busbar, which are arranged diagonal behind an opening of the outer side wall.

A modular interim busbar system 28 is foreseen for the temporary electrical connection of the output terminals 26 of the container 24 with the input terminals 16 of the adapter transformer 12. The modular interim busbar system 28 comprises a frame structure 30 from aluminum bars with three elongated busbar basic modules 32 mounted thereon in an electrical insulating manner. On one end of the respective busbar basic modules 32 first resilient electrical connection means 34 are attached, which form an electrical connection to the output terminals 26 of the container 24. Due to the modular structure of the interim busbars several resilient electrical connection means 34 with different length are available, so that dependent on the requirements on site resilient electrical connection means 34 with a respective suitable size are selectable.

On the respective other ends of the busbar basic modules 32 second resilient electrical connection means 36 are attached, which are part of an electrical connection to the input terminals 16 of the adapter transformer 12. The other end of the second resilient electrical connection means 36 is connected to a respective elongated square-shaped hollow busbar section 38, which is electrically connected with the input terminals 16.

Due to the spring characteristic of the first 34 and second 36 resilient electrical connection means of the modular interim busbar system 32 the transmission of vibrations from the adapter transformer 12 to the container 24 is suppressed in an advantageous way.

Figure 2:
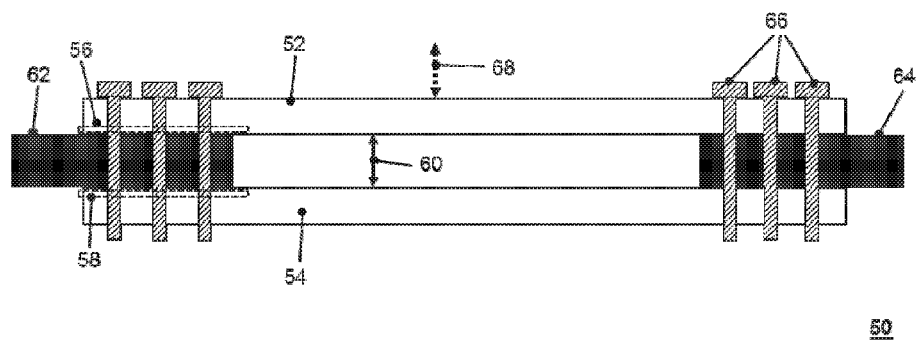
FIG. 2 a first exemplary resilient electrical connection means.

FIG. 2 shows first exemplary resilient electrical connection means 50 in a cross sectional view. A first 52 and a second 54 resilient elongated plate-like clamping element are arranged opposed each to each other in a clamping distance 60 and are both electrical active part of an interim busbar. At both ends of the opposed clamping elements 52, 54 a respective electrical contact section 56, 58 is foreseen wherein respective further electrical active sections 62, 64 of the interim busbar are clamped between. Screws 66 are foreseen for connecting the opposed elongated clamping elements 52, 54 together and apply a pressure force thereon. The screws 66 are extending through holes of the respective contact sections 56, 58 and through the respective electrical further active section 62, 64 of the interim busbar clamped inbetween. The spring characteristic of the resilient electrical connection means is indicated with an arrow 68.

Figure 3:
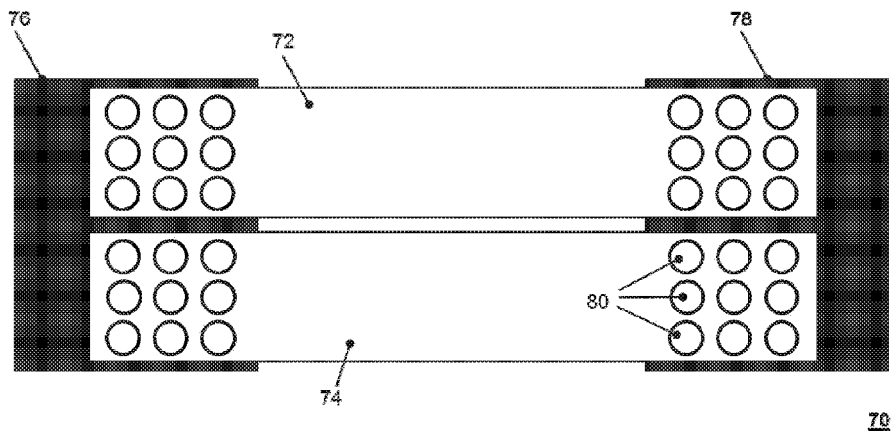
FIG. 3 a second exemplary resilient electrical connection means.

FIG. 3 shows second exemplary resilient electrical connection means 70 from a birds view. Two neighbored clamping elements 72, 74 are arranged in parallel in the same plane. At their both axial ends the clamping elements 72, 74 are connected with a first 76 and a second 78 further electrical active section of a respective interim busbar. Screws 80 are foreseen for connecting the opposed elongated clamping elements 52, 54 together and apply a pressure force thereon.

Figure 4:
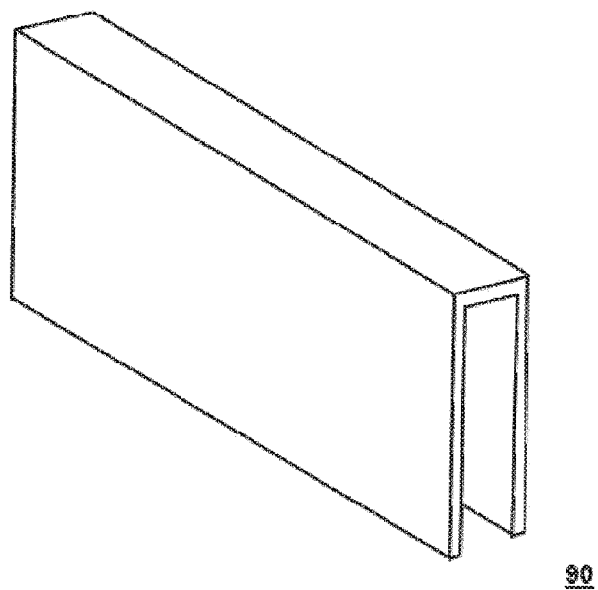
FIG. 4 an elongated square-shaped hollow busbar section.

FIG. 4 shows an elongated square-shaped hollow busbar section in a three dimensional view.

Figure 5:
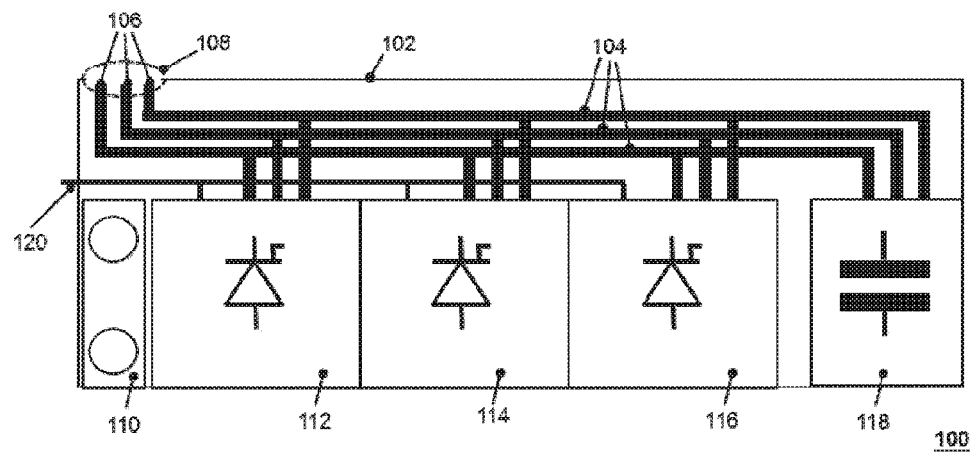
FIG. 5 a low voltage supply system in a mobile container.

FIG. 5 shows a low voltage supply system in a mobile container 102 in a sketch 100. The low voltage supply system comprises a high current busbar 104 which is connected to output-terminals 106 at an opening 108 at the outer side of the container 102. Three electrical frequency converters 112, 114, 116 and a VAR compensator are connected to the busbar 104. The converters 112, 114, 116 are electrically supplied by a busbar for high voltage supply, which can be connected to an external high voltage supply system. A cooling system 110 is foreseen for to ensure that the heat losses are dissipated from the inner of the container.

Figure 6:
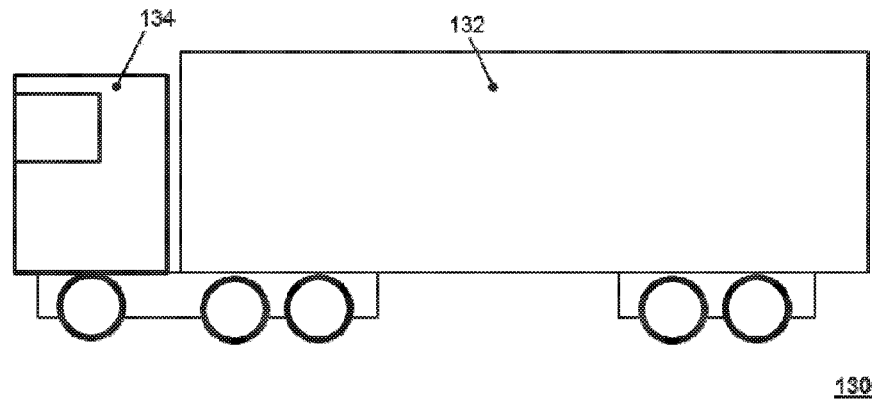
FIG. 6 a mobile container on a truck.

FIG. 6 shows a mobile container 132 with a low voltage supply system on a truck 134 in a sketch 130.

Figure 7:
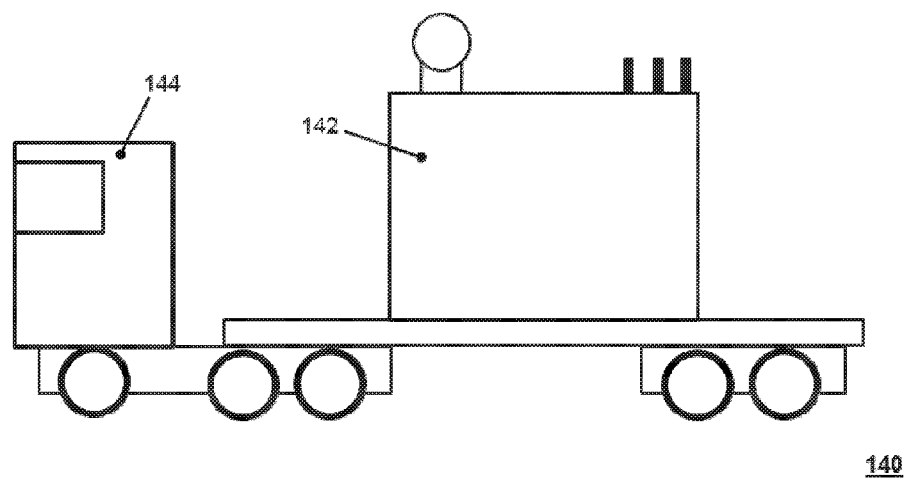
FIG. 7 a mobile adapter transformer on a truck.

FIG. 7 shows a mobile adapter transformer 142 on a truck 144 in a sketch 140.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

LIST OF REFERENCE SIGNS 10 exemplary modular high voltage supply system
12 mobile adapter transformer
14 oil expansion vessel
16 input terminals for input side of adapter transformer
18 lifting lugs
20 output terminals for output side of adapter transformer
22 vibration source
24 mobile container
26 output-terminals for busbar of container
28 modular interim busbar system
30 frame structure
32 elongated busbar basic modules
34 first resilient electrical connection means of modular interim busbar system
36 second resilient electrical connection means modular interim busbar system
38 elongated square-shaped hollow busbar section
40 ground floor
50 first exemplary resilient electrical connection means
52 first resilient elongated plate-like clamping element
54 second resilient elongated plate-like clamping element
56 electrical contact section of first resilient clamping element
58 electrical contact section of second resilient clamping element
60 clamping distance
62 first further electrical active section of interim busbar
64 second further electrical active section of interim busbar
66 exemplary screws
68 direction of resiliency
70 second exemplary resilient electrical connection means
72 first neighbored resilient elongated plate-like clamping element
74 second neighbored resilient elongated plate-like clamping element
76 first further electrical active section of interim busbar
78 second further electrical active section of interim busbar
80 screws
90 elongated square-shaped hollow busbar section
100 low voltage supply system in container
102 mobile container
104 high current busbar
106 output-terminals for busbar of container
108 opening
110 cooling system
112 first electrical frequency converter
114 second electrical frequency converter
116 third electrical frequency converter
118 VAR compensator
120 busbar for high voltage supply
130 mobile container on truck
132 mobile container with low voltage supply system
134 truck
140 mobile adapter transformer on truck
142 mobile adapter transformer
144 truck

The invention claimed is:

1. A modular high voltage supply system, comprising:
a mobile adapter transformer including a high-voltage output side, a low-voltage input side, and electrical connecting input-terminals, configured for the low-voltage input-side, provided at an outer surface of the mobile adapter transformer;
a mobile container including a low voltage supply system mounted stationary therein, the low voltage supply system including a high current busbar and an electrical frequency converter connected thereto, electrical connecting output-terminals for the high current busbar being provided at an accessible edge of the mobile container;
a modular interim busbar system configured for temporary electrical connection of the input- and output-terminals,
wherein the modular interim busbar system includes an interim busbar including an elongated busbar basic module, mounted on a frame structure, and a respective resilient electrical connection on both ends of the busbar basic module which form an electrical connection to the input- and/or output-terminals and which are arranged such that a transmission of vibrations from the mobile adapter transformer to the mobile container is suppressed,
wherein the resilient electrical connection includes a first and a second resilient elongated plate-like clamping element,
wherein the first and second resilient elongated plate-like clamping elements are arranged opposed to each other in a clamping distance,
wherein the first and second resilient elongated plate-like clamping elements are an electrical active part of an interim busbar,
wherein both ends of the opposed clamping elements include a respective electrical contact section, between which a respective further electrical active section of the interim busbar is clamped.

2. The system of claim 1, wherein the opposed elongated plate-like clamping elements are connected together using screws or bolts extending through the respective electrical contact sections and through the respective electrical active section of the interim busbar clamped inbetween.

3. The system of claim 1, wherein the elongated plate-like clamping elements are made at least predominantly from copper or aluminum.

4. The system of claim 1, wherein two or more neighbored clamping elements are arranged in parallel in the same plane instead of a single clamping element.

5. The system of claim 1, wherein the modular interim busbar includes an electrical active elongated square-shaped hollow busbar section.

6. The system of claim 5, wherein the input terminals of the mobile adapter transformer extend into the elongated square-shaped hollow busbar section in a form-locking manner.

7. The system of claim 6, wherein the resilient electrical connection extends into the elongated square-shaped hollow busbar section in a form-locking manner.

8. The system of claim 6, wherein the input terminals or the resilient electrical connection extending into the elongated square-shaped hollow busbar section are connected thereto using screws or bolts.

9. The system of claim 7, wherein the elongated square-shaped hollow busbar section is made at least predominantly from aluminum.

10. The system of claim 1, wherein the modular interim busbar system includes a first, second, and third interim busbar,
wherein the respective busbar basic modules are arranged within the frame structure in a horizontal and vertical distance each to each other.

11. The system of claim 1, wherein the mobile container includes a cooling system.

12. The system of claim 1, wherein the mobile container is a standard container according to CSC (Container Safety Convention) standard.

* * * * *